United States Patent [19]

Wilson

[11] 4,292,590
[45] Sep. 29, 1981

[54] MAGNETOMETER APPARATUS WITH DETECTOR IMMOBILIZED IN WAX

[75] Inventor: James H. Wilson, Severna Park, Md.

[73] Assignee: Westinghouse Electric Corp., Pittsburgh, Pa.

[21] Appl. No.: 93,329

[22] Filed: Nov. 13, 1979

[51] Int. Cl.³ .................... G01R 33/02; C01G 21/16; B65B 23/00; H02G 13/08
[52] U.S. Cl. ................................ 324/226; 324/244; 324/260; 324/345; 53/472; 174/52 PE; 33/305; 206/328
[58] Field of Search ............... 324/200, 202, 225, 226, 324/227, 244, 245, 246, 247, 260–262, 345; 53/472; 174/52 PE; 33/346, 350, 356, 305; 206/328, 521, 584

[56] References Cited

U.S. PATENT DOCUMENTS

| | | |
|---|---|---|
| 1,240,872 | 9/1917 | Perry et al. |
| 2,687,507 | 8/1954 | Schonstedt ........................ 324/246 |
| 2,951,375 | 9/1960 | Summers, Jr. |
| 3,115,784 | 12/1963 | Parker |
| 3,283,592 | 11/1966 | Adler et al. |
| 3,790,882 | 2/1974 | Sharpe ............................. 324/224 |

Primary Examiner—Gerard R. Strecker
Assistant Examiner—Walter E. Snow
Attorney, Agent, or Firm—D. Schron

[57] ABSTRACT

A magnetometer assembly wherein a magnetometer detector suspended from a gimbal is immersed in a wax so as to immobilize the detector. Desired gimbal operation is achieved by heating the wax in the vicinity of the detector.

7 Claims, 7 Drawing Figures

MAGNETOMETER APPARATUS WITH DETECTOR IMMOBILIZED IN WAX

BACKGROUND OF THE INVENTION

1. Field of the Invention

The invention in general relates to magnetic detection devices, and particularly to a magnetometer assembly.

2. Description of the Prior Art

A magnetometer is an instrument for measuring the intensity of a magnetic field. One widely used magnetometer is of the type which provides an output signal indicative of the change in the earth's magnetic field at a particular location, and more particularly the vertical component of the earth's magnetic field.

The magnetometer may be secured in a permanent location with a vertical orientation so as to detect disturbances in the vertical component of the earth's magnetic field, which for example may be caused by the relative proximity of a magnetic object.

In many instances, the structure to which the magnetometer is attached may not have the proper orientations so as to allow the magnetometer to be absolutely vertical. Accordingly, for such situations, the magnetometer assembly includes a housing having a magnetometer therein which is supported by a gimbal arrangement which allows the magnetometer to orient itself vertically if the supporting structure moves.

A problem arises however in that any lateral movement of the holding structure causes the gimbaled magnetometer to swing, thus providing an erroneous output signal.

Further, the magnetometer in such gimbaled arrangement is subject to damage during shipment unless special precautions are taken. This may represent a time consuming and relatively expensive procedure.

SUMMARY OF THE INVENTION

The magnetometer assembly of the present invention obviates these disadvantages. The assembly includes a housing containing a magnetometer detector to sense external magnetic disturbances. The detector is supported in a manner so that it may swing freely so as to assume a vertical orientation. The detector is suspended in a material which is a solid at the normal operating temperature of the detector so as to prevent swinging movement, but is a liquid at a relatively higher temperature so as to allow swinging movement. Means are also provided for heating the material to the higher temperature. In this manner the material is kept in its solid state during shipment, is heated during installation so as to allow the magnetometer detector to assume a vertical orientation and is thereafter a solid during normal intended operation.

DESCRIPTION OF THE PREFERRED EMBODIMENTS

Figure 1:
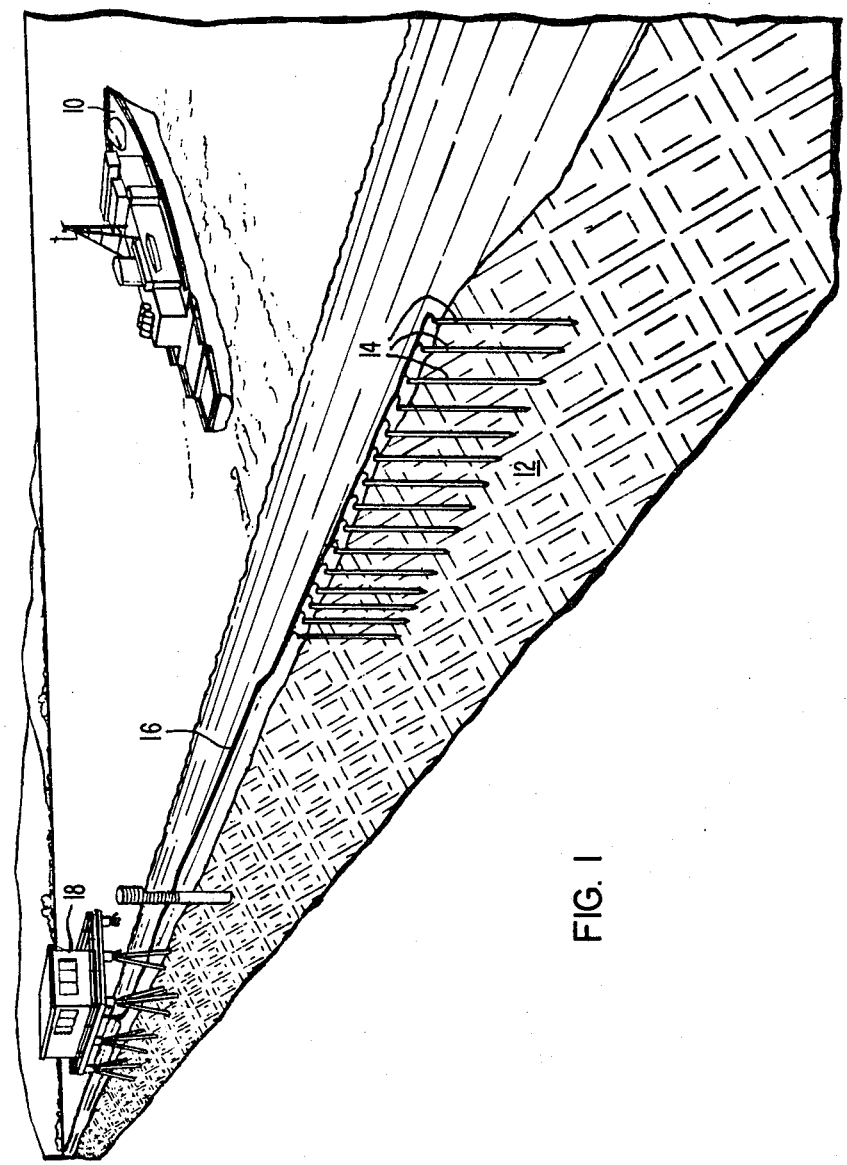
FIG. 1 is a sectional view of a test range for obtaining a ship's magnetic signature, utilizing a magnetometer assemblies.

FIG. 1 illustrates one typical use for magnetometer assemblies. In order to determine what effect a ship will have on the earth's magnetic field, in particular the vertical component of the field, due to its own magnetism, the magnetic signature of the ship is obtained by having the ship relatively move past an array of magnetometer assemblies. In FIG. 1 ship 10 has just passed over an array 12 of magnetometer assemblies contained in protective tubes 14. The output signals from the respective magnetometer assemblies due to the passage and proximity of the ship 10 are provided by means of cables 16 to a monitoring station 18 whereby the magnetic signature for the ship may then be obtained.

Figure 2:
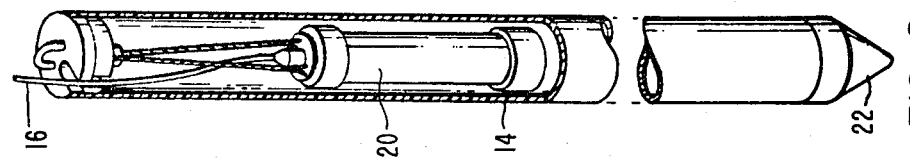
FIG. 2 is a view of a device as illustrated in FIG. 1, with a portion cut away to show a magnetic assembly therein.

In FIG. 2 a magnetometer assembly 20 is seen positioned within protective tube 14 made of non-magnetic material, such as a fiberglass or plastic. Protective tube 14 has a pointed end section 22 to assist during the insertion of the tube into the bed of the body of water. During the insertion phase the tubes are made as nearly vertical as possible so that the magnetometer assemblies, and particularly the detector portion thereof can assume a vertical position for measuring the vertical component of the earth's magnetic field. Some degree of error however is allowable since the detector portion in many types of assemblies is, as will be seen, mounted to swing freely to assume a vertical orientation.

Figure 3:
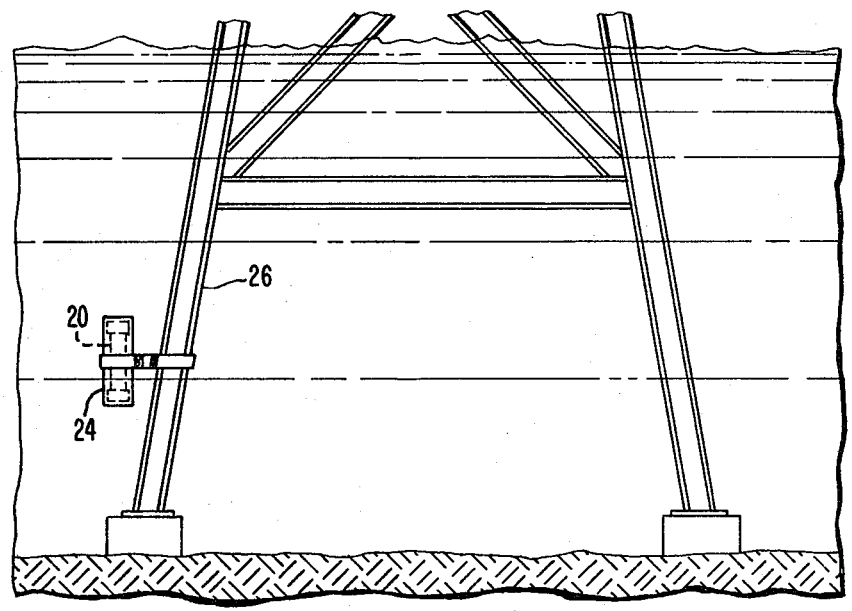
FIG. 3 illustrates yet another use for the magnetometer assembly of the present invention.
Figure 4:
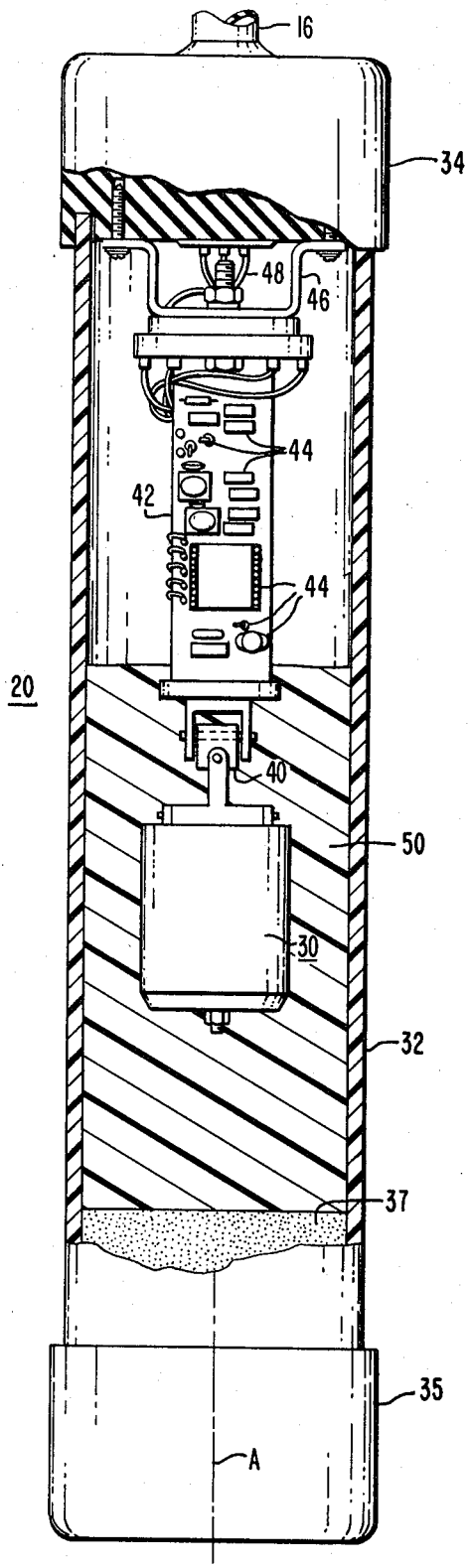
FIG. 4 is a view partially in section and partially broken away of one embodiment of the present invention.

Another use for the magnetometer assembly is illustrated in FIG. 3 wherein a magnetometer assembly package 24 is affixed to a structure 26. The package 24 is mounted so as to assume a vertical position and any tilting movement by the structure 26 will cause a corresponding output signal from the magnetometer assembly which by virtue of its connection to the structure will tilt with it thus assuming a different orientation with respect to the vertical component of the earths magnetic field. A magnetometer assembly in accordance with the present invention for performing such measurements is illustrated in FIG. 4.

The magnetometer assembly 20 includes a magnetometer detector 30 contained within a housing member in the form of a tube 32 symmetrically disposed about a central axis A and having top and bottom end caps 34 and 35. If utilized in an environment where the ambient medium is a liquid, a weight 37 may be provided at the lower portion of the assembly to impart negative buoyancy.

Figure 5:
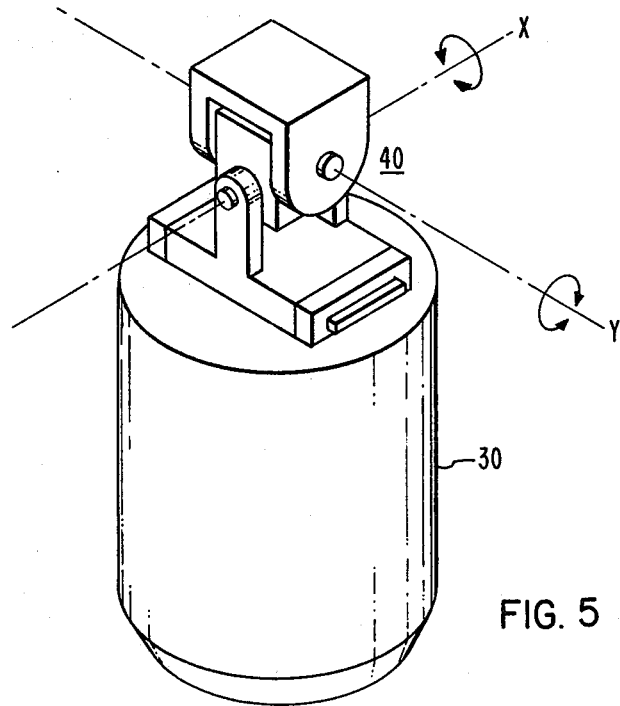
FIG. 5 is a further view of the gimbal arrangement for the magnetometer device used in the assembly.

The magnetometer detector 30 is mounted within the housing 32 so as to swing freely, this action being provided by means of a gimbal assembly 40 which in a well known manner and as illustrated in FIG. 5 allows rotation about mutually orthogonal axes x and y.

Referring once again to FIG. 4, the gimbal assembly 40 is supported at the lower end of a printed circuit board 42 containing electronic components 44 utilized in the operation of the magnetometer detector 30. The printed circuit assembly 42 is in turn supported by means of bracket 46 connected to the top end cap 34. A socket arrangement 48 is operable to conduct power and signals to and from the magnetometer assembly by way of cable 16.

In accordance with the present invention, the housing 32 contains a material 50 in which the magnetometer detector is suspended. The material 50 is of the type which is a solid at the normal operating temperature of the detector so as to prevent swinging movement of it but is a liquid at a relatively higher temperature to allow the detector to assume a vertical position for its operation. Various mineral waxes having the appropriate melting point are suitable for use as the material and may be introduced into the housing 32 while in a liquid state to a level preferably covering the gimbal assembly 40.

Thus, when the material is a solid state, the magnetometer assembly may be handled and be subjected to shock and vibration without the magnetometer detector banging into the housing since the solidified wax holds the detector solidly with respect to the housing. During installation, heat is applied to material 50 to melt it at least at the vicinity of the magnetometer detector 30 so as to allow gimbaled movement thereof and the assumption of a vertical orientation. Thereafter the heat is removed to return material 50 to its solidified form so that any output from detector 30 represents a magnetic disturbance caused either by a relative tilting of the assembly 20 or the proximity of a magnetic object.

Figure 6:
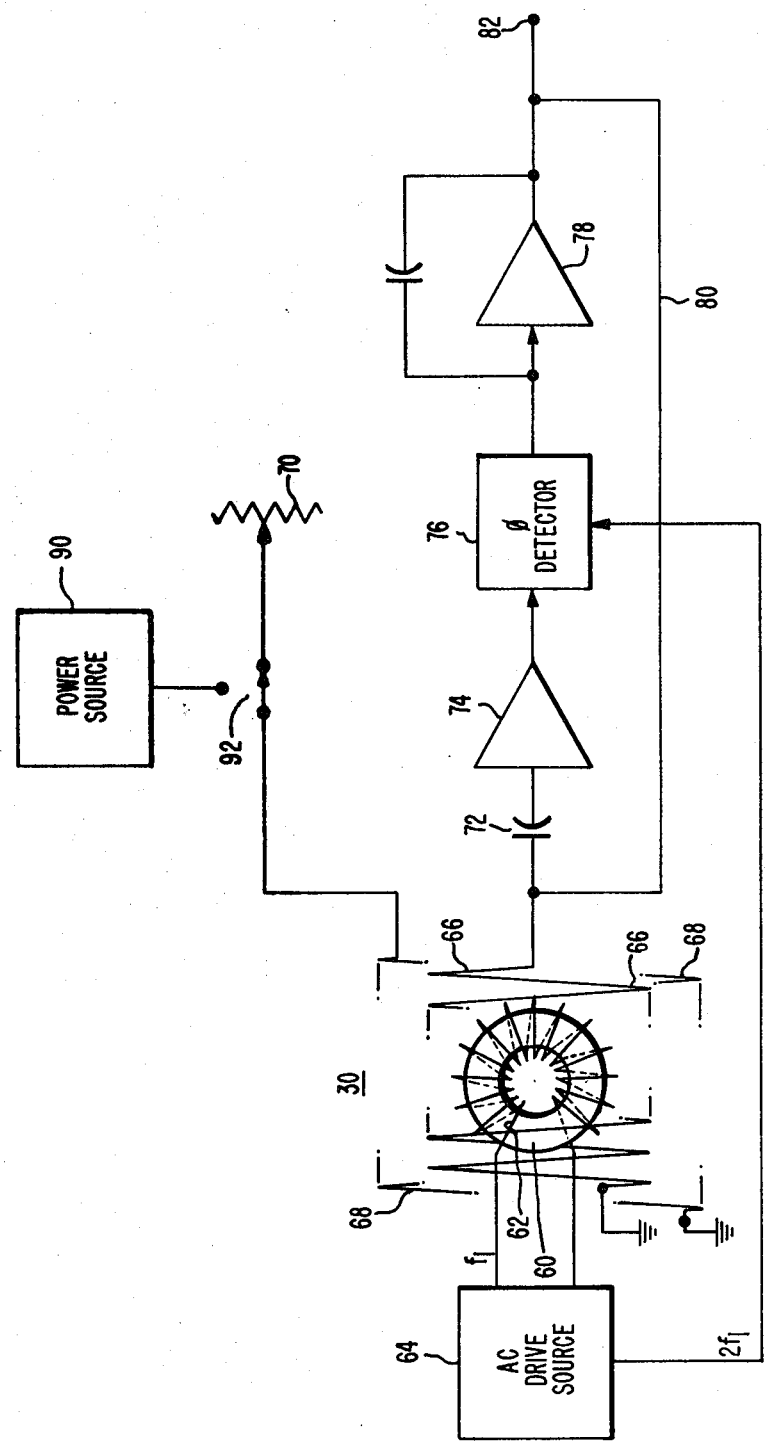
FIG. 6 is a circuit diagram illustrating the operation of the magnetometer device and the present invention.

FIG. 6 illustrates one means for performing the heating operation to melt the material in the vicinity of the detector. In one form the detector 30 includes a toroidal core 60 having a torodial winding 62 thereabout supplied with an AC drive signal from drive source 64, the signal having a frequency $f_1$. A solonoid or sense winding 66 is wound about the core 60 and winding 62 and coil 68 utilized for nulling the effects of the earth's magnetism is also included. Each cycle of the drive signal of frequency $f_1$ drives the toroidal core 60 into positive and negative saturation which has the effect of modulating any external magnetic field with a frequency $2f_1$. The modulation of the magnetic field results in an output signal provided by sense winding 66. In order to increase the sensitivity, of the apparatus, a small current, the value of which is adjustable by potentiometer 70, is provided to coil 68 so as to provide a magnetic field equal and opposite to the earth's magnetic field so that in the normal quiescent operating condition sense winding 66 provides no output signal.

Should the magnetic field thereafter change due to a different orientation of the detector or the presence of a disturbing magnetic influence, there will result an output signal from sense winding 66 which is coupled by means of capacitor 72 to amplifier 74. The amplified signal is provided to a phase or synchronous detector 76 which is additionally provided with a signal of frequency $2f_1$ from drive circuit 64, this frequency being the same as that of the other signal provided to phase detector 76. Phase detector 76 in effect operates as an electronic switch which is provided with a gating signal from drive source 64 to gate the signal from amplifier 74 to an intergrator 78, the output signal of which is fed back via line 80 to the sense winding 66. The integrator output signal fed back to the sense winding 66 drives a current through the winding to counteract and nullify the disturbance whereupon the former output signal of sense winding 66, and therefore the input to phase detector 76 and its output to integrator 78 goes to zero. The voltage at the output 82 of the integrator 78 therefore is indicative of how much signal was fed back to counteract the change, and consequently is indicative of the magnitude of the change.

In one embodiment of the present invention, a power source 90 is provided for supplying a relatively high current to the existing coil 68 causing it to generate heat of sufficient value so as to liquify material 50 surrounding the detector 30. Manually or electrically operable switch means 92 is provided for selecting power supply 90 to be connected to coil 68 for initial installation of the apparatus and thereafter for selecting the lower and adjustable current for initial and continual nullification of the earth's magnetic field.

Figure 7:
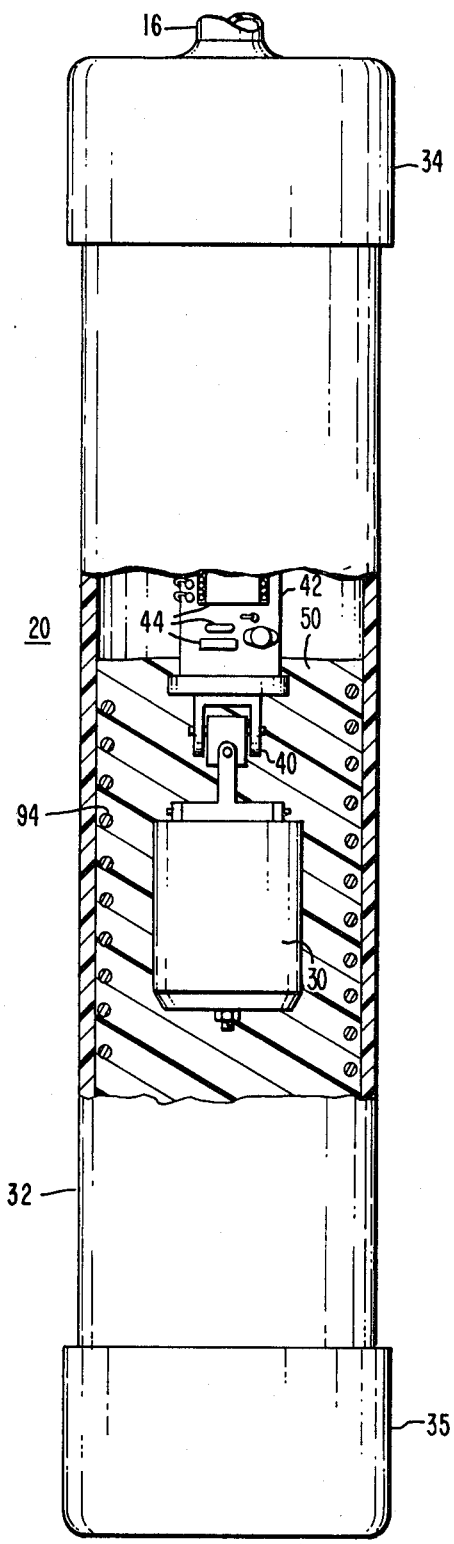
FIG. 7 is a view as in FIG. 4 further illustrating another embodiment.

FIG. 7 illustrates another means by which the material 50 may be heated to its higher temperature to cause melting thereof. The embodiment of FIG. 7 includes a heating coil 94 which preferably is located within housing 32 so as to allow operation in a water medium. Coil 94 is disposed around magnetometer detector 30 and is spaced therefrom so as to allow gimbal action when material 50 is in its liquified state in the vicinity of detector 30. Current for heating coil 94 may be supplied via cable 16.

I claim:
1. A magnetometer assembly comprising:
(a) a housing;
(b) a magnetometer detector disposed within said housing to sense external magnetic disturbances;
(c) support means for supporting said detector and being of the type which allows said detector to swing freely so as to assume a vertical orientation;
(d) said detector being suspended in a material which is a solid at the normal operating temperature of said detector so as to prevent swinging movement of said detector but is a liquid at a relatively higher temperature so as to allow swinging movement of said detector; and
(e) means for heating said material to said higher temperature.
2. Apparatus according to claim 1 wherein:
(a) said support means is a gimbal which allows rotation of said detector about two mutually perpendicular axes; and wherein,
(b) said material covers said gimbal.
3. Apparatus according to claim 1 wherein:
(a) said material is a wax.
4. Apparatus according to claim 1 wherein:
(a) said detector includes an electrical coil normally used for nulling the effects of the earth's magnetism; and which includes;
(b) means for supplying said coil with electrical energy to generate heat of sufficient values so as to liquify said material.
5. Apparatus according to claim 1 wherein:
(a) said means for heating includes a heating coil disposed within said housing.
6. Apparatus according to claim 5 wherein:
(a) said coil is disposed around said detector.
7. Apparatus according to claim 6 wherein:
(a) said coil is spaced from said detector.

* * * * *